(12) United States Patent  
Koo et al.

(10) Patent No.: US 7,989,756 B2
(45) Date of Patent: Aug. 2, 2011

(54) ACTIVE-ISOLATION MOUNTS FOR OPTICAL ELEMENTS

(75) Inventors: Shiang-Lung Koo, Belmont, CA (US);
Yi-Ping Hsin, Dublin, CA (US);
Hideyuki Hashimoto, Saitama (JP);
Bausan Yuan, San Jose, CA (US);
Pai-Hsueh Yang, Palo Alto, CA (US)

(73) Assignee: Nikon Corporation, Tokyo (JP)

( * ) Notice: Subject to any disclaimer, the term of this patent is extended or adjusted under 35 U.S.C. 154(b) by 286 days.

(21) Appl. No.: 12/262,115

(22) Filed: Oct. 30, 2008

(65) Prior Publication Data

US 2009/0237793 A1 Sep. 24, 2009

Related U.S. Application Data

(60) Provisional application No. 61/069,966, filed on Mar. 18, 2008.

(51) Int. Cl.
*G02B 7/00* (2006.01)

(52) U.S. Cl. ............... 250/216; 250/201.4; 250/548; 359/822; 359/824

(58) Field of Classification Search ............ 250/216, 250/201.4, 221, 548; 359/813, 814, 819, 359/822, 823, 824
See application file for complete search history.

(56) References Cited

U.S. PATENT DOCUMENTS

| | | | |
|---|---|---|---|
| 5,383,168 A * | 1/1995 | O'Brien et al. | ............ 369/44.14 |
| 6,803,994 B2 | 10/2004 | Margeson | |
| 6,840,638 B2 | 1/2005 | Watson | |
| 6,842,277 B2 | 1/2005 | Watson | |
| 6,930,842 B2 | 8/2005 | Shibazaki | |
| 2007/0286035 A1 | 12/2007 | Uchida | |
| 2009/0009742 A1 | 1/2009 | Arai | |

FOREIGN PATENT DOCUMENTS

| | | |
|---|---|---|
| JP | 2001-343575 | 12/2001 |
| JP | 2004-064069 | 2/2004 |
| JP | 2004-064076 | 2/2004 |
| JP | 2004-119695 | 4/2004 |
| JP | 2005-004146 | 1/2005 |
| JP | 2007-316132 | 12/2007 |

* cited by examiner

*Primary Examiner* — Kevin Pyo
(74) *Attorney, Agent, or Firm* — Klarquist Sparkman LLP

(57) ABSTRACT

Disclosed are, inter alia, optical components that include an optical element (e.g., mirror) and at least three active-isolation mounts mounting the optical element to a frame (e.g., optical barrel or optical frame). An active-isolation mount has a non-contacting actuator connecting a respective location on the optical element to the frame and provides movability of the respective location relative to the frame in at least one direction. At least one displacement sensor is associated with each respective location on the optical element. The displacement sensors are sensitive to displacements of the respective locations in at least one respective direction and reference the displacements to an absolute reference. The actuators and sensors are connected to a servo control loop to provide feedback control.

36 Claims, 14 Drawing Sheets

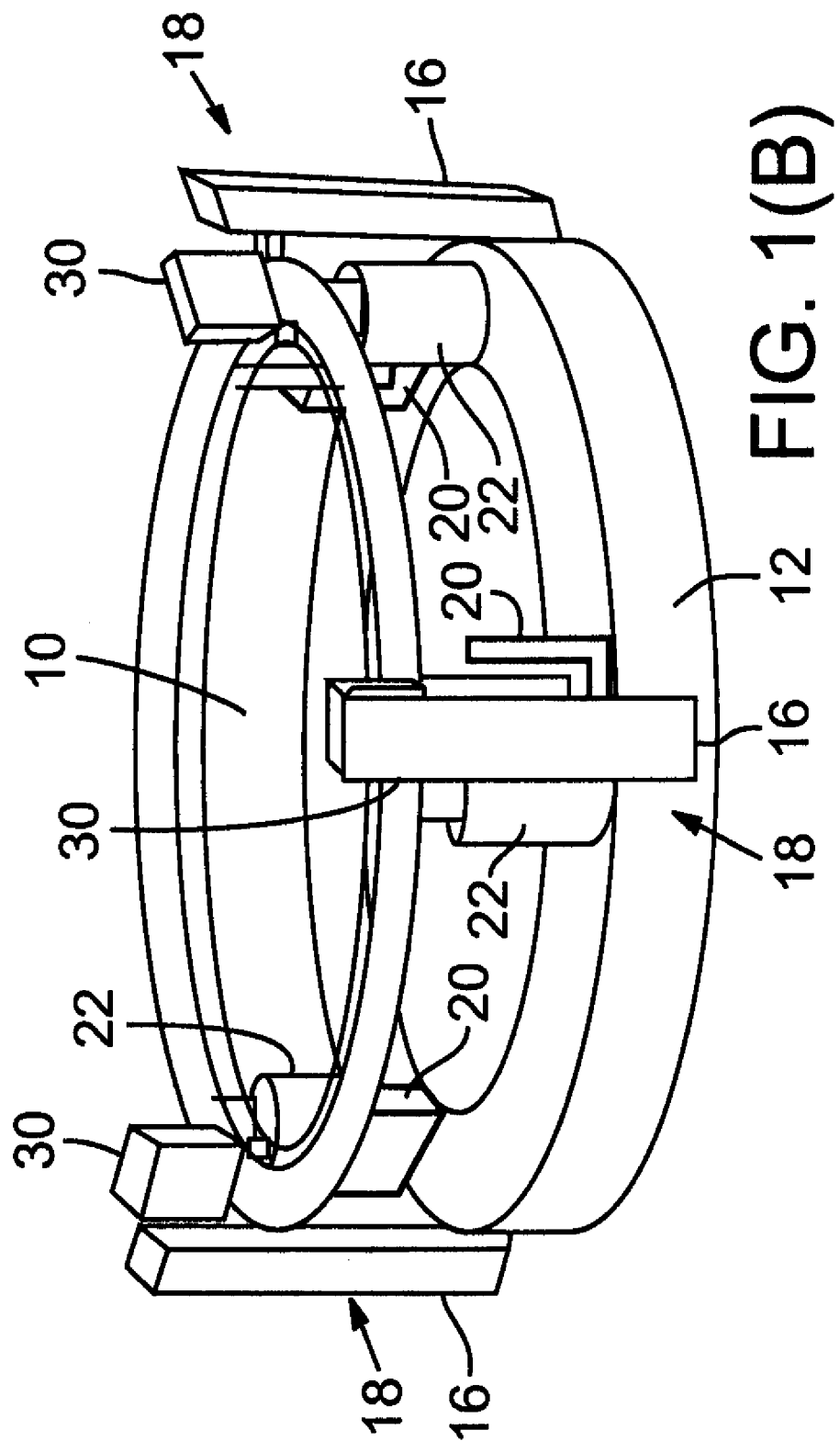

ACTIVE-ISOLATION MOUNTS FOR OPTICAL ELEMENTS

CROSS-REFERENCE TO RELATED APPLICATION

This application claims priority from, and the benefit of, U.S. Provisional Application No. 61/069,966, filed on Mar. 18, 2008, which is incorporated herein by reference in its entirety.

FIELD

This disclosure pertains to, inter alia, devices for holding an optical element in a "barrel," optical frame, or other support structure for optical elements of an optical system. More specifically, the disclosure pertains to "active" mounts that provide isolation of the optical element from vibrations and the like that otherwise would be transmitted to the optical element from the support structure.

BACKGROUND

With the development of optical systems expected to provide extremely high levels of optical performance, much attention has been directed to the accuracy and precision to which the constituent optical elements are manufactured. Attention has also been directed to the manner in which the optical elements of the system are mounted relative to each other on a frame or in a "barrel." To increase the optical performance of certain optical systems even further, the barrel is configured to provide a stringently controlled operational environment for the optical elements, such as controlled temperature and pressure. In addition, the barrel or frame is mounted on a machine frame by mounts that damp or attenuate transmission of vibrations from the machine frame to the barrel.

An exemplary technology in which high-performance optical systems are critical is microlithography. Microlithography is essentially a photographic process by which fine patterns, such as micro-circuit patterns, are transferred or otherwise formed on an exposure-sensitive substrate such as a glass, ceramic, or crystalline plate or a semiconductor wafer, for example. In the manner of a photographic process, microlithography utilizes light or other energy beam to expose the pattern image on the substrate.

Since the advent of microlithography, the workhorse wavelength of light for making microlithographic exposures has progressively shortened from the deep-ultraviolet (DUV) range to the vacuum-UV (VUV) range, the latter ranging approximately from 150 to 300 nm. Recently, substantial effort has been directed to the development of a practical microlithography system utilizing "extreme-UV" (EUV) wavelengths in the range of 11 to 15 nm, most typically approximately 13.5 nm. The trend of using progressively shorter wavelengths of exposure light in microlithography is based on the principle that reducing the wavelength of exposure light generally provides better and finer imaging resolution. In other words, a shorter wavelength of exposure light generally can form a pattern on the substrate with better resolution of correspondingly finer pattern elements, compared to a longer wavelength.

Whereas DUV and VUV optical systems can be totally refractive or catadioptric (the latter having both refractive and reflective optical elements), EUV optical systems must be all-reflective (catoptric) because no known materials are suitable for making EUV lenses. In an EUV optical system, the constituent reflective optical elements are generally called "mirrors." Except for grazing-incidence mirrors, the optical surface of a typical EUV mirror includes a multilayer film to maximize reflectivity to incident EUV light. (The maximum achievable reflectivity is approximately 70%.)

The mirrors of an EUV optical system, such as a projection-optical system, are mounted in a barrel or optical frame using mirror mounts. Mirror mounts are usually configured to hold the mirror in the barrel or frame accurately without over-constraining the mirror. The mirror mounts usually are also configured, at least in a passive manner, to attenuate transmission of disturbances and vibrations from the barrel to the mirror. Also, the barrel or optical frame is usually attached to other system structure using vibration-isolation mounts that inhibit transmission of external disturbances to the barrel or frame from other parts of the machine or from the floor in which the machine is placed. In some systems the mounts of at least one mirror of the EUV optical system are "active-isolation" types in which the mirror is provided with slight controlled movability relative to the barrel or optical frame as required to maintain a desired position of the mirror despite movements of the barrel. The movability is controlled by feedback to compensate mirror position, that otherwise would be affected by movements of the barrel or optical frame, and thus improve image quality. A mirror or other element having such mounts is called an "active-isolation-mounted" element.

Conventionally, the active-isolation mounts for a mirror in an EUV optical system comprises mirror servos of which the actuators are piezoelectric transducers (abbreviated herein as "PZTs"). (Note that "PZT" in the relevant art also denotes lead zirconate titanate, a piezoelectric ceramic material. Lead zirconate titanate is a common material, but not the only material, for making PZTs. Hence, not all PZTs are made of lead zirconate titanate.) Piezoelectric materials are distorted by application thereto of an electric field. Piezoelectric ceramic materials used in PZTs are electrically poled during manufacture by applying a large electric field during high-temperature annealing of the material. The PZT is placed, in contact with the mirror, between the mirror and a rigid and stable support. During use of the PZT, application of an electric field along the polarization direction forces the ceramic material to expand in directions perpendicular to the electric field. Conversely, application of an electric field in a direction opposite the polarization direction forces the ceramic material to contract in directions perpendicular to the electric field. This expansion or contraction imposes a local stress on the mirror. For general information regarding an optical mount including PZT actuators, see U.S. Pat. No. 6,317,195, particularly FIG. 1 and associated text, incorporated herein by reference. PZTs are compact, light-weight, and rugged, and operate in a consistent and controllable manner. The amounts of mirror motion provided by the PZTs are very small but nevertheless adequate.

Unfortunately, it is difficult for PZT actuators used as mirror servos to meet the stringent specifications of an EUV microlithography system for reasons such as the following: (1) PZT elements have high stiffness. Since they directly contact either the mirror or other structure in contact with the mirror, vibrations are readily transmitted via the PZT elements from the barrel or optical frame to the mirror. (2) PZT elements are continuously energized to hold their positions, which can produce vibrations and transmit them to the mirror. (3) PZT elements in combination with structure in which they are in contact tend to produce additional vibrational modes. For example, a PZT servo can interact with the mirror and produce additional vibrational modes of the mirror. (4) Disturbances of the barrel or frame are mainly of relatively high frequency. Mirror servos based on PZT elements have relatively low bandwidth, which prevents the PZT-actuated mirror from catching up with high-frequency movements of the lens barrel or optical frame. Since the ability to prevent transmission of disturbances is currently evaluated based on the relative distance between the mirror and the lens barrel, this results in unacceptable rejection of disturbances propagating from the barrel or frame to the mirror.

Therefore, there is a need for improved servos for use in active-isolation mounts for optical elements, such as but not limited to reflective optical elements ("mirrors") used in an EUV optical system or other high-performance catadioptric or catoptric optical system.

SUMMARY

The need articulated above is satisfied by various aspects of the invention disclosed and claimed below. According to a first aspect, optical components are provided, wherein an embodiment thereof comprises an optical element (e.g., a mirror) and at least three active-isolation mounts by which the optical element is mounted to a first frame (e.g., an optical barrel or optical frame). Each active-isolation mount comprises a respective non-contacting actuator connecting a respective location on the optical element to the first frame and providing movability of the respective location relative to the frame in at least one direction. At least one displacement sensor is associated with each respective location on the optical element. The displacement sensors are sensitive to displacements of the respective locations in at least one respective direction. This embodiment also includes a servo-control loop to which the actuators and displacement sensors are connected.

The servo-control loop compares the optical-element displacement data (produced by the sensors) to an absolute position reference to determine positional disturbances being experienced by the optical element. The servo-control loop also determines corrective energizations to apply to the actuators to offset the disturbance. The servo-control loop generally includes a controller or processor that is connected to the actuators and to the displacement sensors. The controller is responsive to the displacement data in delivering corrective energizations to the actuators to maintain position of the optical element relative to the absolute reference whenever the first frame experiences a disturbance of sufficient magnitude to impart a significant disturbance to the optical element.

The displacement sensors desirably are utilized to produce data on position of the respective locations on the optical element relative to a corresponding position on the first frame. To such end, the optical component can further comprise a distance-measuring device that measures the distance from the first frame to a vibrationally quiet second frame to which the first frame is mounted, wherein the second frame serves as the absolute position reference. An example distance-measuring device for this purpose comprises at least one interferometer. An advantageous type of sensor comprises a "laser scale," wherein at least one respective laser scale is associated with each location.

The active-isolation mounts also desirably include respective anti-gravity devices ("AG devices") that collectively support at least most of the mass of the optical element against gravitational force, relative to the first frame.

Particularly advantageous non-contacting actuators are non-contacting electro-magnetic actuators such as voice-coil motors (VCMs) and EI-core actuators, and combinations thereof. These and other types of non-contacting actuators have a first portion that, when the actuator is energized, moves relative to a second portion thereof without physically contacting the second portion. Hence, vibrations are substantially not transmitted by the actuator from one portion to the other. Other advantages include: (a) optical elements of an optical system in which these actuators are used can be made substantially unaffected by disturbances transmitted from the first frame, and (b) in contrast to PZT-based and other contact-type actuators, these non-contacting actuators do not introduce additional vibrational modes into the optical system In another embodiment each displacement sensor comprises a respective accelerometer. Accelerometers are advantageous sensors because accelerometers provide their own respective absolute references relative to which the accelerometers acquire data relating to changes of position of the optical element.

According to another aspect, mounts are provided for attaching an optical element to an optical frame (e.g., an optical barrel or other type of frame). An embodiment of such a mount includes multiple non-contacting electromagnetic actuators that are attachable to respective locations on the optical element and that connect the respective locations to respective locations on the optical frame. At least one displacement sensor is associated with each respective location. The displacement sensors are sensitive to displacements of the respective locations and produce data related to the displacements. The actuators and sensors are connected in a servo-control loop by which optical-element displacement data, produced by the sensors, are compared to an absolute reference to determine a positional disturbance being experienced by the optical element and to determine corrective energizations to apply to the actuators.

By way of example, the displacement sensors can comprise respective laser scales, wherein the absolute reference is a vibrationally quiet second frame to which the optical frame is mounted. In another example, the displacement sensors comprise respective accelerometers, wherein the absolute reference is integral to the sensors.

According to another aspect, optical systems are provided. An embodiment thereof comprises an optical frame and an optical element. At least three active-isolation mounts are used to mount the optical element to the optical frame. Each active-isolation mount comprises a respective non-contacting actuator that connects a respective location on the optical element to the optical frame and provides movability of the respective location relative to the optical frame in at least one direction. At least one displacement sensor is associated with each respective location on the optical element. The displacement sensors are sensitive to displacement of the respective locations in at least one respective direction. A controller is connected to the actuators and to the displacement sensors to provide a servo-control loop by which the optical-element displacement data, produced by the sensors, are compared to an absolute position reference to determine a positional disturbance being experienced by the optical element, and corrective energizations are determined by the controller to apply to the actuators to offset the disturbance.

According to another aspect, microlithographic systems are provided that comprise at least one optical system as summarized above. For example, the microlithographic system can be an extreme ultraviolet microlithographic system, of which the optical elements are reflective.

Yet another aspect is a method, in the context of an optical system mounted in a frame, for vibrationally isolating an optical element in the optical system from vibrations associated with a disturbance imparted to the frame. An embodiment of such a method comprises mounting the optical element to the frame using multiple non-contacting actuators that connect respective locations on the optical element to respective locations on the frame to provide movability of the respective locations relative to the optical frame in at least one respective direction. Respective displacements of the respective locations on the optical element, in at least one respective direction, are sensed. Optical-element displacement data, produced by the sensors, are compared to an absolute reference to determine an optical-element position error associated with the positional disturbance. Corrective energizations for application to the actuators are determined so as to offset the vibrations of the optical element caused by the disturbance. These energizations are applied to the actuators to achieve the vibration offset. The sensing step desirably is performed using respective positional sensors such as, but not limited to, respective accelerometers, which provide their own absolute references. Other types of sensors can be used, such as laser scales, in which the absolute reference is, for example, the position of a vibrationally quiet second frame to which the frame is mounted.

The foregoing and additional features and advantages of the invention will be more readily apparent from the following detailed description of the embodiments, which proceeds with reference to the accompanying drawings.

BRIEF DESCRIPTION OF THE DRAWINGS

FIG. 1(B) is a schematic perspective view of the embodiment shown in FIG. 1(A).

DETAILED DESCRIPTION

Figure 1A:
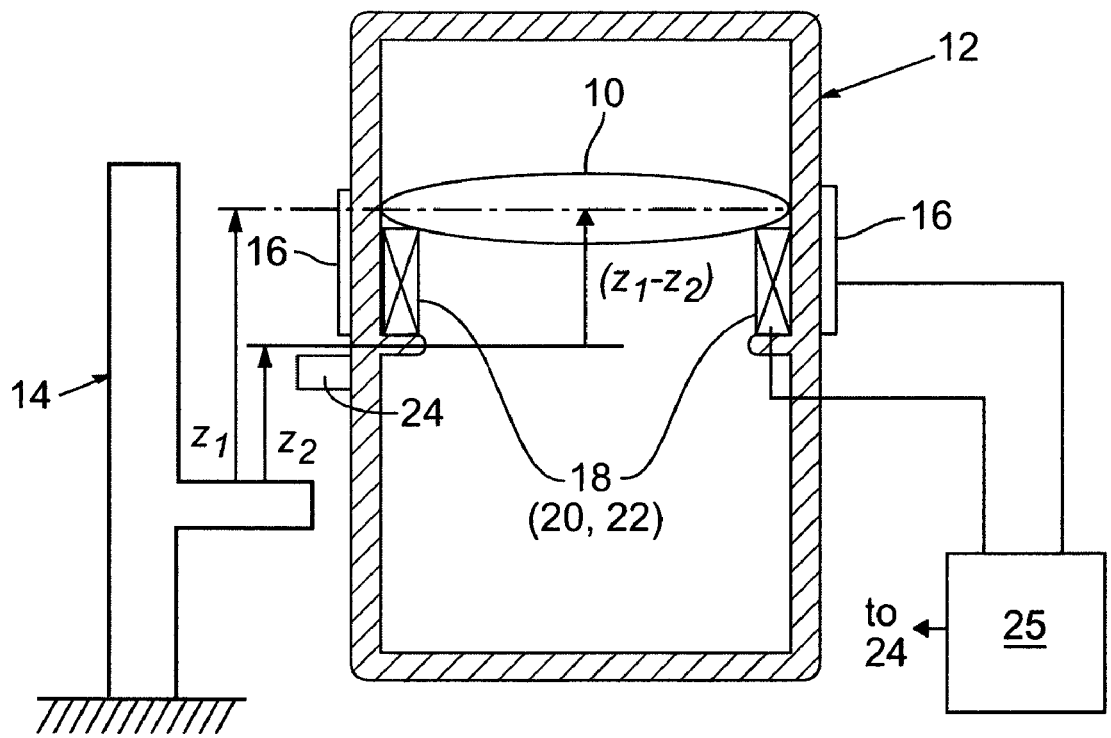
FIG. 1(A) is a schematic elevational view of an embodiment of an active-isolation mirror mount that senses position of the metrology frame and uses such position data as reference data for the active-isolation mount.

This disclosure is set forth in the context of multiple representative embodiments that are not intended to be limiting in any way.

In the following description certain words are used, such as "upward," "downward," "vertical," "horizontal," and the like. These words are used to provide clarity of the descriptions when read in the context of the drawings. Whereas these words are useful in understanding relative relationships, they are not intended to be limiting. For example, a device depicted in a drawing readily can be turned upside down, resulting in an "upper" surface becoming a "lower" surface, and vice versa.

As discussed above, vibrations and disturbances can originate in or be transmitted by a barrel or optical frame of a high-performance optical system (e.g., of a microlithography system). Although these vibrations and disturbances tend to be of relatively high frequency, it is advantageous that a critical optical element in the system be mounted in the barrel or frame in an active-isolation manner such that the elements are servoed to an "absolute" reference (a reference that, for practical purposes, is extremely stable) rather than to the barrel or optical frame, which may not be sufficiently "quiet" from a vibration standpoint. (To "servo" a mirror to a thing means to use the thing as a reference, relative to which the mirror position and movements are determined and controlled by a servo mechanism.)

In microlithography systems, providing an absolute reference for the mirror servos can be achieved in either of two ways, as discussed below. A first way is to use the "metrology frame" as a reference. A second way is to include inertia sensors, e.g., accelerometers or geophones, in the active-isolation mount for the mirror.

A metrology frame is one of at least two separate major frames, aside from an optical frame or barrel, typically present in a modem microlithography system. Another major frame is the base frame to which the metrology frame is typically mounted in a vibrationally isolated manner. The base frame, in turn, typically rests in a vibrationally isolated manner on the floor of the facility in which the microlithography system is installed. To ensure stable images and positional measurements, the imaging optics and metrology devices (e.g., stage interferometers) are mounted on the metrology frame. Whenever practical, hardware that could disturb the stability and integrity of imaging, such as moving parts and heat sources, are mounted to the base frame rather than the metrology frame. The optical barrel or optical frame is mounted in a vibration-isolation manner to the metrology frame.

The embodiments discussed below are directed to, inter alia, optical elements mounted on active-isolation mounts and including respective sensing schemes (for servo control) and respective types of servo-controlled actuators. The actuators are "non-contacting" linear actuators, by which is meant that the actuator comprises a first portion that, when energized, causes movement of a second portion relative to the first portion without physically contacting the first portion. Certain types of electro-magnetic actuators are non-contacting, such as (but not limited to) voice-coil motors (VCMs) and EI-core actuators. By being non-contacting, these actuators can inhibit vibration transmission from their first portions to their second portions, and vice versa. A given optical element may have actuators of all the same type, or combinations thereof, for mounting the optical element to an optical barrel or frame.

VCMs are electromagnetic actuators that provide controlled linear movements over short distances. When properly controlled electronically, VCMs provide good accuracy and repeatability. VCMs exhibit flat force characteristics that are advantageous for this application in which precise control of position is required. A VCM can develop force in either axial direction by simply reversing the polarity of its electrical excitation. This bidirectionality combined with VCMs' low inductance enables them to achieve very short cycle times.

An EI-core actuator is a linear, electromagnetic actuator so named because of its two main components. The first component is the E-core, which is usually a three-barred structure having a shape resembling the letter "E," with an insulated electric coil wire wound around the center bar and a current source connected to the coil. Current flowing through the coil creates an electromagnetic field that attracts an associated I-shaped core. Typically, the E-core is attached to a frame, and the I-core is attached to a structure to be moved or positioned relative to the E-core (without contacting the E-core) so that movement of the I-core imparts a corresponding movement force to the structure. EI-core actuators produce precise motions over short distances, with very low vibration, while generally consuming less electric current than VCMs.

Key advantages of non-contacting actuators such as VCMs and EI-core actuators are: (1) optical elements of the optical system in which the actuators are used can be made substantially unaffected by disturbances transmitted from the barrel or optical frame, and (2) in contrast to PZT and other contact-type actuators, non-contacting actuators do not introduce additional vibrational modes into the optical system. As exemplary non-contacting actuators, VCMs and EI-core actuators advantageously have favorable electric characteristics that include fast dynamics.

Exemplary VCMs are discussed in, for example, U.S. Pat. No. 7,333,179, incorporated herein by reference. EI-core actuators are discussed in, for example, U.S. Pat. Nos. 7,253,576; 7,046,496; 6,323,494; and 6,472,777, incorporated herein by reference.

Mirrors and other optical elements usually have substantial size and mass. In most instances, this mass may not be supported entirely by the servo actuators due to the heat generated by the supplied constant current to the servo actuators. Hence, various embodiments include "anti-gravity" devices (AG devices) for supporting most if not all the mass of the optical element relative to the barrel or optical frame. Exemplary AG devices are discussed in, for example, U.S. Pat. No. 7,193,683, incorporated herein by reference.

By way of example, the following discussion is directed to a mirror movably mounted to a barrel or optical frame using AG devices for support of the mirror against the force of gravity and using VCMs as servoed actuators that respond to disturbances applied to the barrel or optical frame. A physical-plant model and sensing scheme of such an assembly were evaluated under conditions in which the barrel or optical frame receives a disturbance force. The physical-plant model was simplified to one degree of freedom (1 DOF) of motion, namely z-direction motion. It is easy to extrapolate the 1-DOF results to multiple DOFs because, by design, the multiple-DOF motion can be decoupled into multiple individual 1-DOF motions The dynamic equations of the assembly (for one DOF) are given by:

$$m\ddot{z}_1 + d_a(\dot{z}_1 - \dot{z}_2) + k_a(z_1 - z_2) = f_{VCM}(z_1, z_2, r) \quad (1)$$

$$M\ddot{z}_2 + d_a(\dot{z}_2 - \dot{z}_1) + k_a(z_2 - z_1) = F - f_{VCM}(z_1, z_2, r) \quad (2)$$

where $f_{VCM}(z_1, z_2, r)$ is the force produced by the VCM actuator in the z-direction; F is the disturbance force imparted to the barrel in the z-direction; $m\ddot{z}_1$ and $M\ddot{z}_2$ are respective forces applied to the mirror and barrel; $d_a(\dot{z}_1 - \dot{z}_2)$ and $d_a(\dot{z}_2 - \dot{z}_1)$ are respective AG-damping terms; and $k_a(z_1 - z_2)$ and $k_a(z_2 - z_1)$ are respective AG-spring terms. The nomenclatures of the model parameters and variables are listed in Table 1, along with exemplary values of certain of the parameters.

TABLE 1

| Denotation | Description | Exemplary Value |
| --- | --- | --- |
| r | reference trajectory | |
| $z_1$ | position of mirror relative to reference | |
| $z_2$ | position of optical barrel relative to reference | |
| m | mass of mirror | m = 20 kg |
| M | mass of optical barrel | M = 780 kg |
| $k_a$ | equivalent spring constant of anti-gravity device | $k_a$ = 402 kg/m |
| $d_a$ | equivalent damping constant of anti-gravity device | $d_a$ = 3158 kg · s/m |
| F | disturbance force | |
| $f_{VCM}$ | actuator force produced by VCM | |
| $T_s$ | sampling time | $T_s$ = 0.0002 s |

It will be understood that $\ddot{z}_1$ and $\ddot{z}_2$ are second derivatives and $\dot{z}_1$ and $\dot{z}_2$ are first derivatives of the positions $z_1$ and $z_2$, respectively. In Table 1, the mirror has a substantial exemplary mass (e.g., m=20 kg). This mass cannot be supported by VCMs alone due to certain concerns such as the constant-current induced heating issued mentioned above. To support at least most of the mass of the mirror, the AG devices are used.

FIG. 1(A) illustrates a first embodiment, which senses and corrects mirror position $z_1$ relative to the metrology frame used as an absolute servo reference. In this embodiment the mirror 10 is contained in an optical barrel 12. The optical barrel 12 is supported relative to the metrology frame 14. Note the mirror position $z_1$ relative to the metrology frame 14, the barrel position $z_2$ relative to the metrology frame, and the position difference $(z_1-z_2)$ representing the position of the mirror 10 relative to the barrel 12. The mirror 10 is supported relative to the barrel 12 by mirror mounts 18. At least three mirror mounts 18 are required (a total of three mirror mounts 18 is desirable because three mirror mounts hold the mirror 10 in a self-leveling tripod manner). Each mirror mount 18 includes a respective VCM 20 and a respective anti-gravity (AG) device 22. Associated with each mirror mount 18 is a respective laser scale 16.

The laser scales 16 are used for determining $(z_1-z_2)$, the position of the mirror 10 relative to the barrel 12, at each mirror mount 18. A "laser scale" is a small, compact, laser-based position sensor that operates at close range to the object whose position is being sensed. Compared to a conventional laser interferometer, a laser scale is relatively insensitive to drift or air turbulence.

The distance $z_2$ is typically too long to determine using a laser scale, so an interferometer 24 may be used instead. The distance $z_1$ can be determined by simple calculation from determined values of $z_2$ and $(z_1-z_2)$. The laser scales 16, the VCMs 20, and the interferometer 24 are connected to a controller 25. The controller 25 servos the VCMs to the metrology frame 14 by receiving positional data from the laser scales 16 and interferometer 24 and using the positional data to determine required actuations of the VCMs.

A more detailed depiction of this embodiment is shown in FIG. 1(B), which provides a perspective view. Shown are a portion of the optical barrel 12 to which three laser scales 16 are attached, as well as three respective mirror mounts 18. Each mirror mount 18 includes a respective VCM 20 and a respective AG device 22. The mirror mounts 18 are spaced equi-angularly to each other.

Figure 1C:
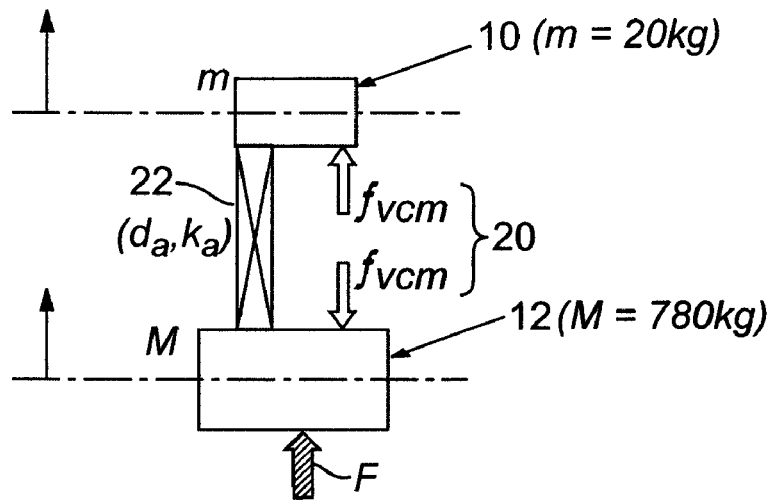
FIG. 1(C) is a simplified model of the system shown in FIG. 1(A), showing the mirror, an anti-gravity device, a voice-coil motor (VCM) used as an actuator in the active-isolation mount, and the barrel.

FIG. 1(C) is a simplified diagram of the mirror 10, an AG device 22, and the optical barrel 12. By way of example, the mirror 10 has a mass m=20 kg, and the optical barrel 12 has an exemplary mass of M=780 kg. The AG device 22 is effectively a combination of a spring (having an equivalent spring constant $k_a$=402 kg/m, for example) and a damper (having an equivalent damping constant $d_a$=3158 kg·s/m, for example). The natural frequency of the AG device 22 was selected to be 2 Hz. In FIG. 1(C) a disturbance force F is shown being applied to the optical barrel 12. Respective arrows indicate the positions $z_1$ of the mirror and $z_2$ of the barrel, as affected by the disturbance force F. As discussed above, the position of the mirror relative to the barrel $(z_1-z_2)$ and the position $z_2$ are determined. Under control of the controller 25, as the barrel 12 experiences the disturbance F, the VCM 20 is actuated to apply active-isolation forces $f_{VCM}$ to the mirror 10 and barrel 12. According to this embodiment, the absolute position $z_1$ of the mirror 10 is determined, without having to change the configuration of the optical system in the barrel 12, by using the interferometer 24 for determining the absolute position $z_2$ of the barrel. From $z_2$ and $(z_1-z_2)$, $z_1$ is readily determined.

In the first embodiment described above, the position of the mirror 10 is determined relative to the metrology frame 14, wherein the metrology frame serves as an absolute reference. However, under certain conditions, servoing to the metrology frame 14 in the manner of the first embodiment may be difficult due to rigorous configurational or other requirements, or certain limitations, associated with the metrology frame. The first embodiment relies upon the metrology frame 14 being very quiet with respect to vibrations. But, if the metrology frame is not sufficiently quiet, then the achievable accuracy of active isolation provided by the first embodiment may be too limited.

Figure 2A:
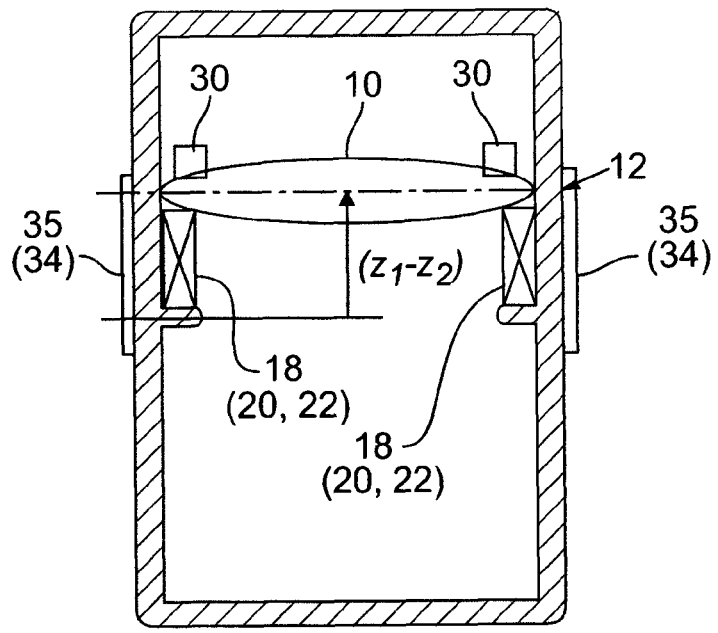
FIG. 2(A) is a schematic elevational view of an embodiment of an active-isolation mirror mount that senses mirror position ($z_1$) using inertia sensors (e.g., accelerometers) coupled to the mirror, and uses such position data as reference data for the active-isolation mount.

In a second embodiment an alternative way of providing an absolute servo reference comprises using one or more inertia sensors to estimate the absolute position $z_1$ of the mirror. This embodiment is shown in FIG. 2(A), in which accelerometers 30 are used as exemplary inertia sensors. Inertia sensors such as accelerometers 30 are advantageous in this embodiment because they serve as their own respective absolute references. (See FIG. 1(B) for general placement of accelerometers 30.)

Figure 2B:
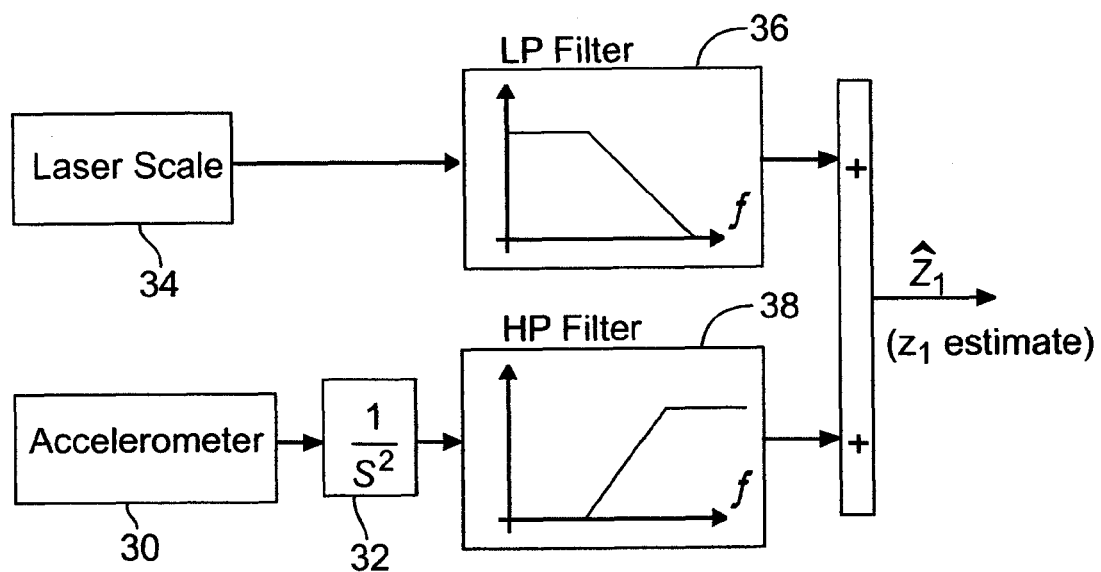
FIG. 2(B) is a synthesis algorithm, used in connection with the embodiment of FIG. 2(A), for determining an estimated mirror position ($\hat{z}_1$) relative to the barrel used as an inertia frame.

Upon application of a disturbance force F, respective signals produced by the accelerometers 30 are fed into a double integrator 32 that produces data on corresponding changes in mirror position $(z_1)$ relative to the absolute reference position of the mirror. At low frequencies, sensor noise, sensor error, and DC bias may be amplified and could contaminate the position signal significantly. The mirror-position signal is much more accurate and reliable at high frequencies. To improve accuracy, a laser scale 34 provides a good low-frequency position signal $z_1$ since $z_1$ is almost constant at low frequencies. The mirror in this embodiment includes three laser-scale frames 35. Each laser-scale frame comprises two laser scales 34 (not detailed): one for measuring relative displacement in the vertical direction and the other for measuring relative displacement in the horizontal direction. The total of six laser scales 34 measure relative displacements in 6 DOFs. As a result, the algorithm desirably includes a cross-over network, as shown in FIG. 2(B). Note that, in theory, the sum of the outputs of the low-pass filter 36 and the high-pass filter 38 are unity (1) to avoid distortion of the absolute position signal.

Figure 3A:
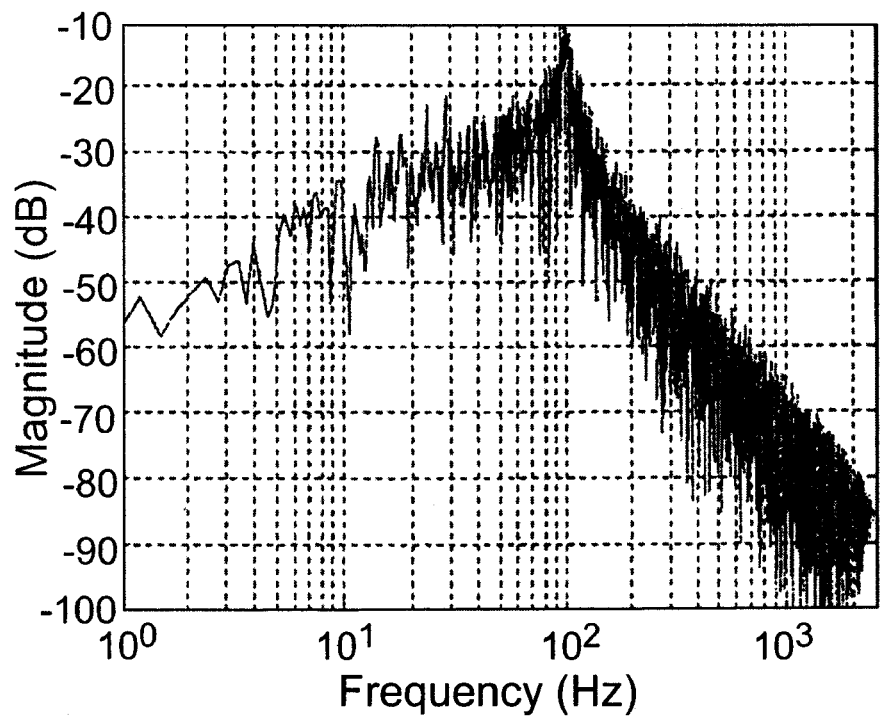
FIG. 3(A) is a magnitude (dB) versus frequency (Hz) spectrum of simulated, disturbance-induced position errors produced by wide-band noise routed unfiltered to the physical plant.
Figure 3B:
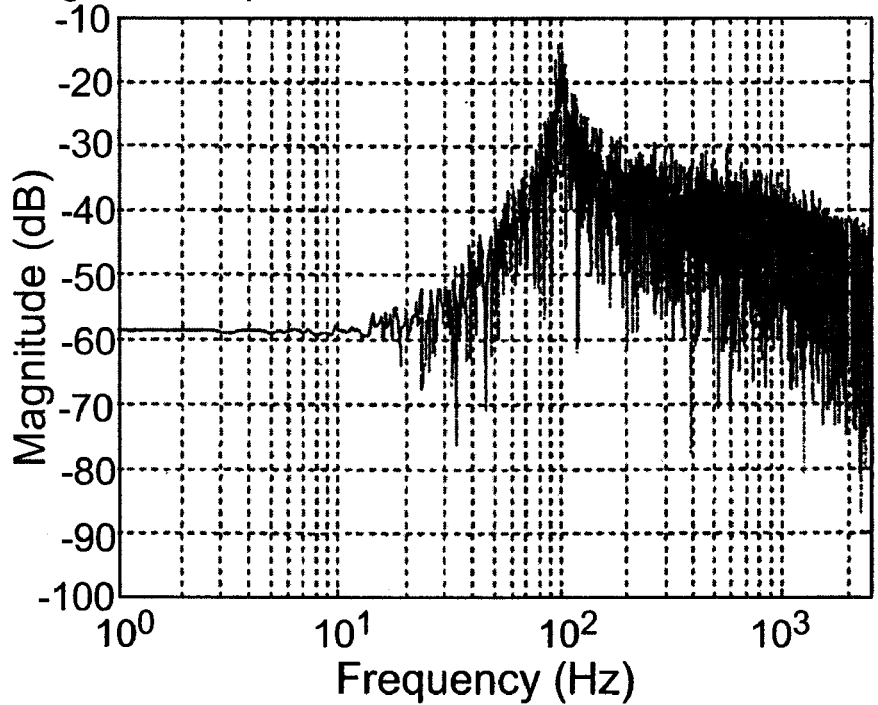
FIG. 3(B) is a magnitude (dB) versus frequency (Hz) spectrum of simulated, disturbance-induced position errors produced by wide-band noise filtered by passage through two high-pass filters connected in series before routing to the physical plant, thereby removing accuracy-degrading low-frequency components of the noise signal.
Figure 3C:
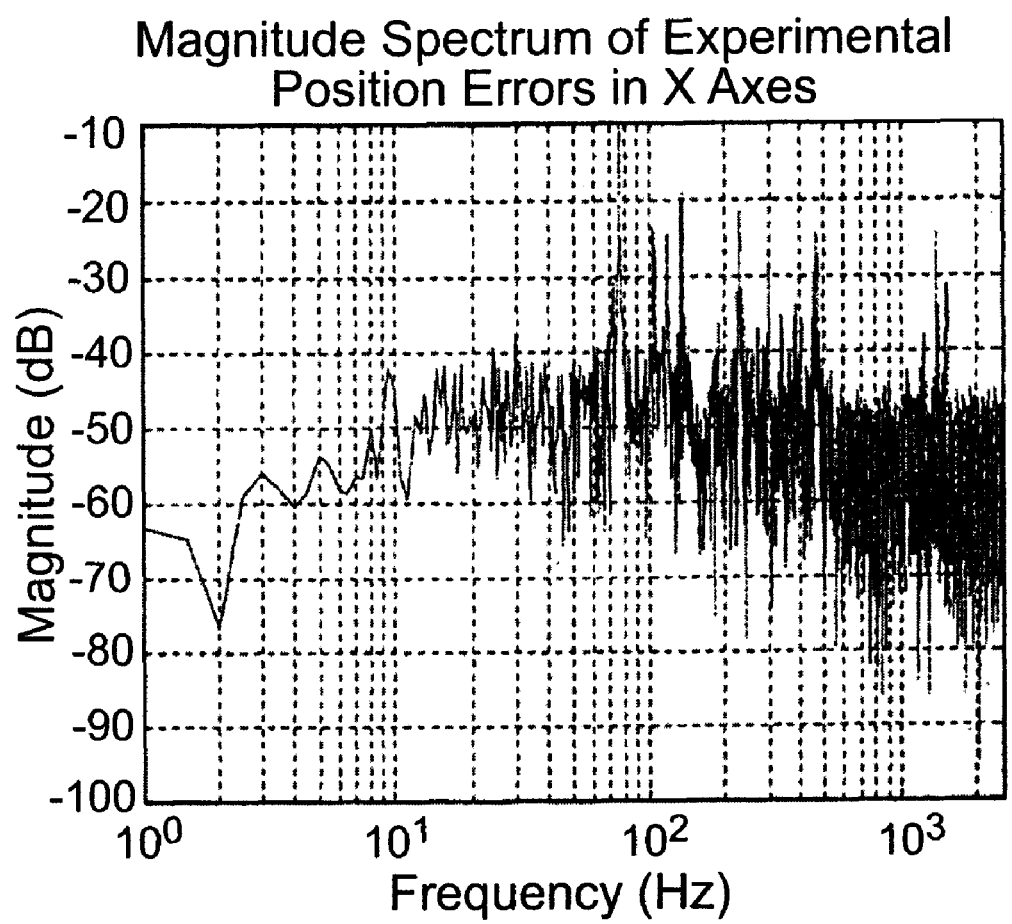
FIG. 3(C) is a magnitude (dB) versus frequency (Hz) spectrum of actual experimental position errors, used as a comparison reference plot for FIGS. 3(A) and 3(B).

In a disturbance-simulation model utilized for evaluation purposes, to simulate disturbance-induced position errors of the mirror 10 from experimental data, wide-band noise was fed into two high-pass filters connected in series before being injected into the physical plant. In the model, noise entered the system at force level. Without the treatments provided by the two high-pass filters, the high-frequency spectrum of the relative distance $(z_1-z_2)$ decayed at the rate of 40 dB/decade, in the general manner of a two-mass model. But, such a result does not comply with the experimental data. FIGS. 3(A) and 3(B) show the spectra of the position error obtained while not using and while using the high-pass filters. With use of the high-pass filters, the spectrum obtained from the simulation is more similar to the spectrum obtained from the experimental data (see FIG. 3(C)), especially at high frequencies and except for some resonant peaks, compared to not using the high-pass filter.

Currently available accelerometers have approximate acceleration-measuring accuracy of $10^{-5}$ m/s$^2$. In the simulations, white noise of this level and some DC bias were injected into the accelerometer signal to reflect the accuracy and the noise problems.

Simulation Results

Figure 4A:
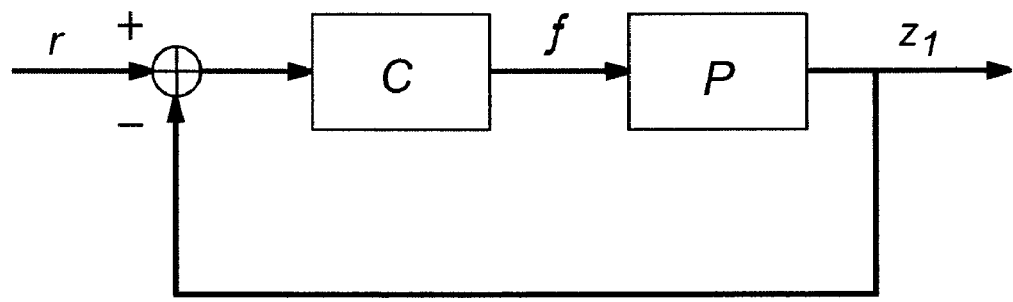
FIG. 4(A) is a schematic diagram of an embodiment of the mirror servo based upon actual determinations of mirror displacement ($z_1$).
Figure 4B:
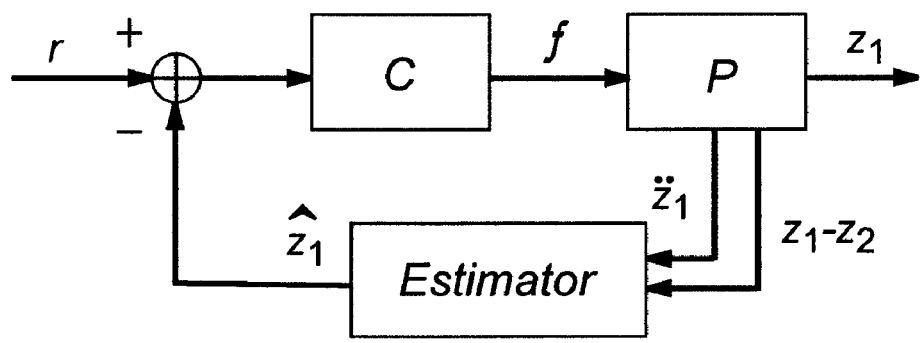
FIG. 4(B) is a schematic diagram of an embodiment of the mirror servo based upon $\hat{z}_1$ (estimated values of $z_1$) for use when $z_1$ cannot be measured directly.

When referencing to the metrology frame 14, the absolute position $z_1$ of the mirror 10 can be calculated using the geometric relation of the mirror relative to the metrology frame. FIG. 4(A) is a schematic of the mirror servo whenever values of mirror position $z_1$ are available. In FIG. 4(A), "r" and "f" are as in Table 1, "P" is physical plant, and "C" is the controller. If $z_1$ cannot be determined directly, then an estimation algorithm can be used. FIG. 4(B) shows an example servo utilizing an estimate of $z_1$, designated "$\hat{z}_1$". The estimator integrates the signals from the laser scale ($z_1-z_2$) and from the accelerometers ($\ddot{z}_1$), as applicable. In this diagram, the estimate of $z_1$, namely $\hat{z}_1$, is fed back into the controller (C) rather than the actual $z_1$. Simulation results based on the above two embodiments are set forth below.

Mirror Servo Based on Metrology Frame

Figure 5A:
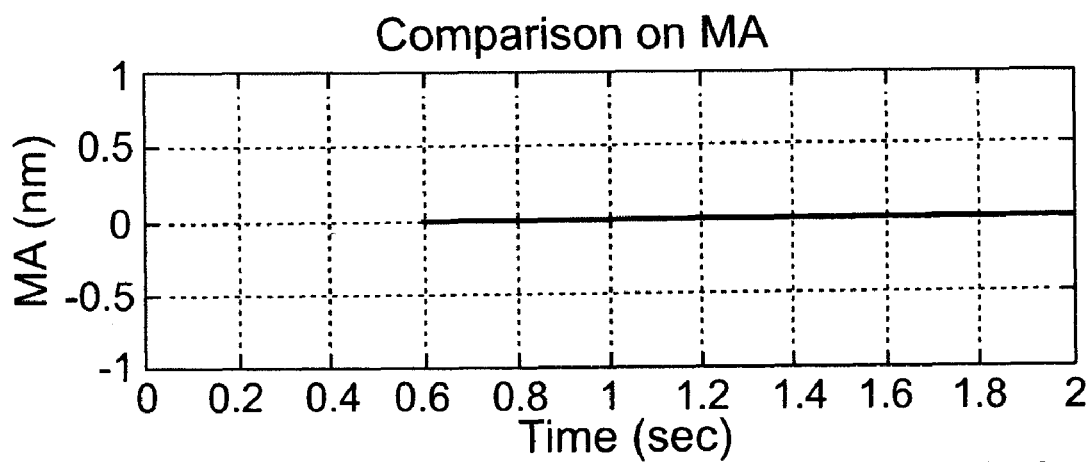
FIG. 5(A) is a moving average (MA) plot of the mirror position $z_1$ as affected by a disturbance force, obtained in simulations in which control of current to an active-isolation actuator is assumed to be perfect in view of the bandwidth of the actuator-current control being much higher than of the actual actuator (VCM in this instance). The simulation did not include anti-gravity devices, and $z_1$ was used in the feedback loop (FIG. 4(A)).
Figure 5B:
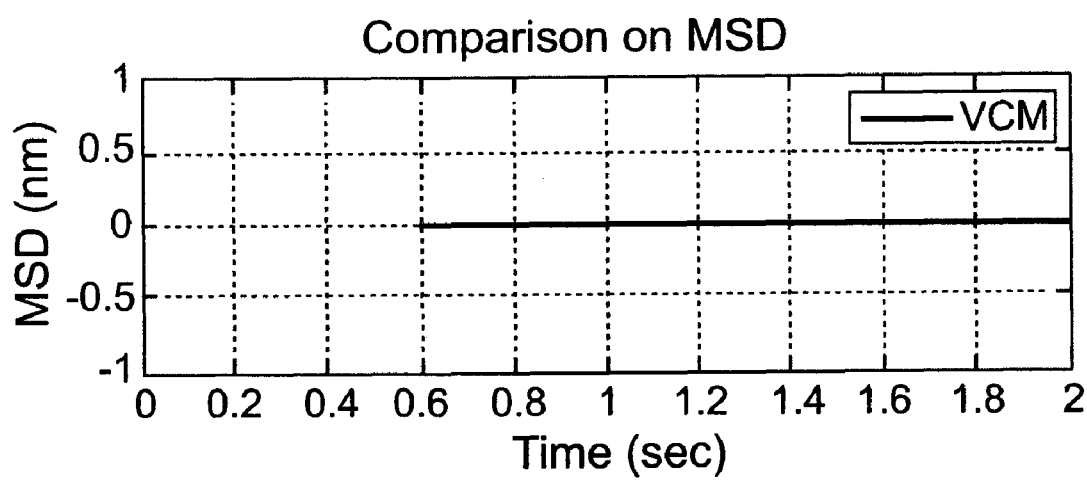
FIG. 5(B) is a moving standard deviation (MSD) plot corresponding to the MA plot of FIG. 5(A).

Without AG devices the bandwidth of the VCM motor-current control is typically much higher than of the VCM mechanical system. (Motor-current control reduces back-EMF and the like from the VCMs that otherwise would be manifest without motor-current control.) As a result of its high bandwidth, the VCM motor-current control is assumed to be perfect. The VCM motor-current controller addresses the induced current. Hence, there is no coupling between the two portions of the VCM. As a result, the transfer function from the disturbance force to the mirror position $z_1$ is zero. Simulation results are shown in FIGS. 5(A) and 5(B), exhibiting zero MA (moving average) and zero MSD (moving standard deviation), respectively.

Figure 6A:
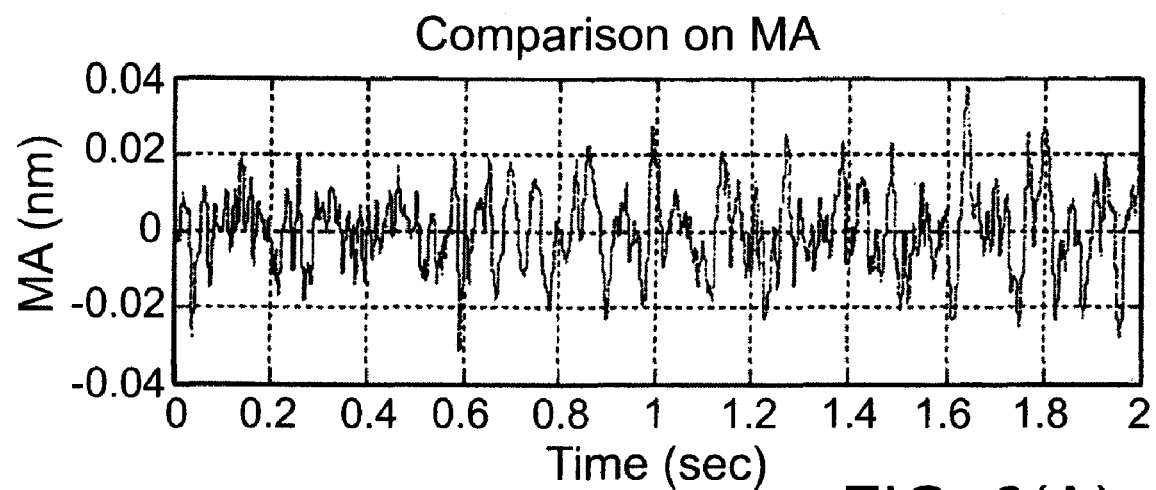
FIG. 6(A) is an MA plot of $z_1$ for a condition similar to that of FIG. 5(A) except that the simulation included anti-gravity devices ($z_1$ was still used in the feedback loop).
Figure 6B:
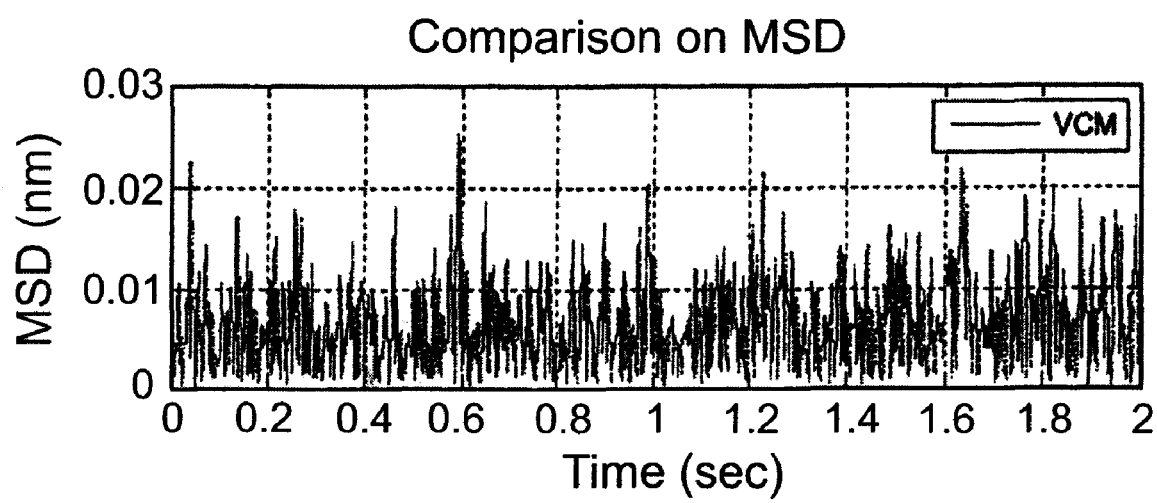
FIG. 6(B) is an MSD plot of $z_1$ corresponding to the MA plot of FIG. 6(A).

In the vertical direction, the VCM does not provide sufficient force to support the mirror. Anti-gravity devices are necessary to support at least most of the load. However, incorporating AG devices produces a slight deviation from "perfect" disturbance rejection. FIGS. 6(A)-6(B) illustrate the simulation results of such a coupling effect between the AG devices and the VCMs.

Mirror Servo Based on Additional Inertia Sensor

Figure 7A:
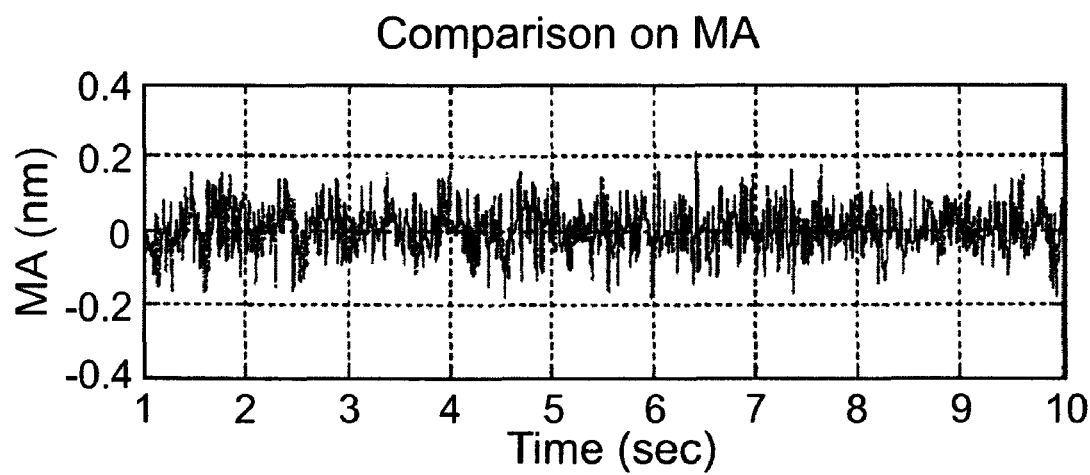
FIG. 7(A) is an MA plot of $z_1$ for a condition similar to that of FIG. 6(A), except that $\hat{z}_1$ was used in the feedback loop (FIG. 4(B)). The simulation included anti-gravity devices.
Figure 7B:
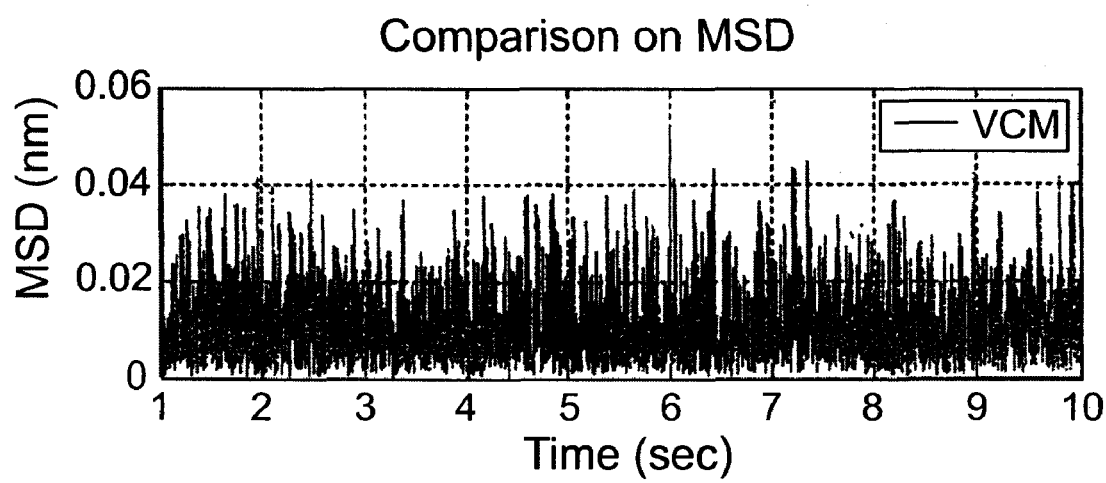
FIG. 7(B) is an MSD plot of $z_1$ corresponding to the MA plot of FIG. 7(A).

When using the $z_1$ estimate (i.e., $\hat{z}_1$) in the feedback loop, it is expected that the high-frequency disturbance rejection would be worse. As illustrated in FIG. 2(B), $\hat{z}_1$ includes the filtered $z_1-z_2$. Hence, the mirror servo follows the filtered $-z_2$ to some extent. FIGS. 7(A)-7(B) show the simulation results. It is readily apparent that the MSD in FIG. 7(B) is larger than the MSD in FIG. 6(B).

Figure 8A:
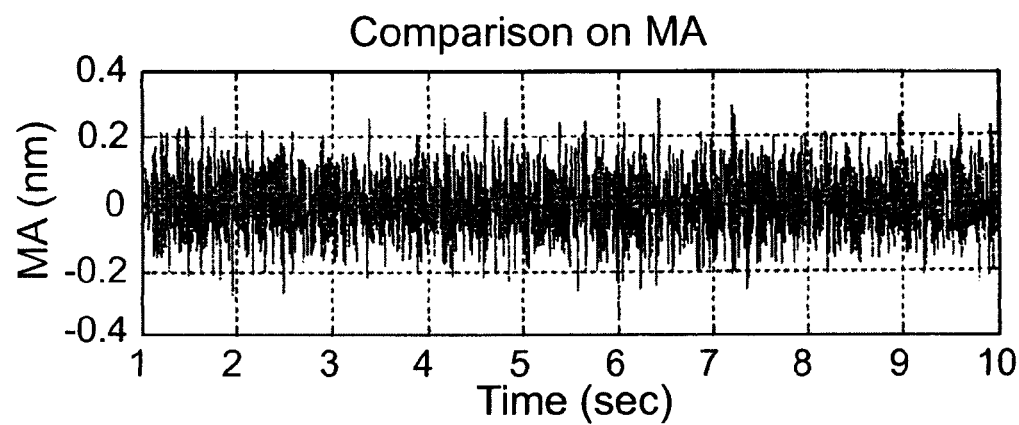
FIG. 8(A) is an MA plot of $\hat{z}_1$ for a condition in which anti-gravity devices were used and $\hat{z}_1$ was used in the feedback loop.
Figure 8B:
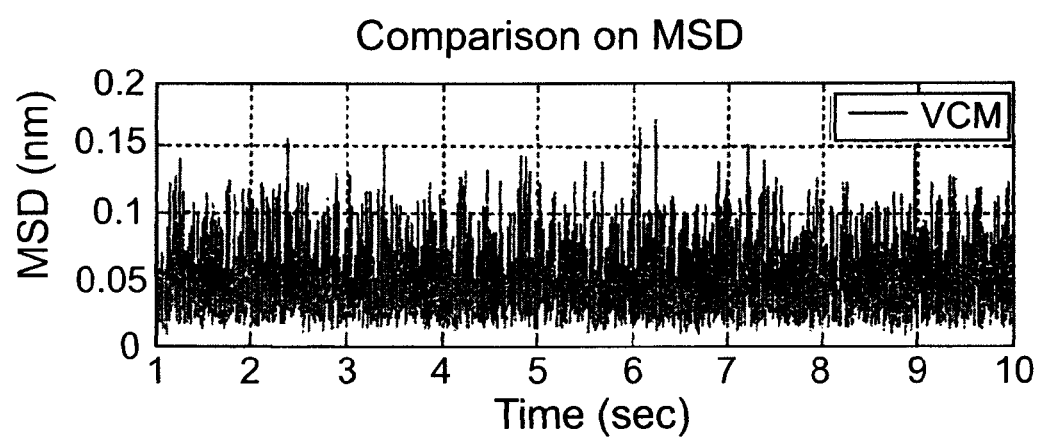
FIG. 8(B) is and MSD plot of $\hat{z}_1$ corresponding to the MA plot of FIG. 8(A).

In the simulations, the MA and the MSD of the actual $z_1$ can be evaluated at any time. However, in reality some measures desirably are utilized to ensure adequate performance of disturbance rejection whenever $z_1$ cannot be directly measured. FIGS. 8(A)-8(B) show such measures, namely the MA and MSD, respectively, of $\hat{z}_1$, the estimate of $z_1$. The MA and MSD in FIGS. 8(A)-8(B) are approximately 2-fold to 3-fold greater than in FIGS. 7(A)-7(B), respectively. A different set of filters could be applied to produce an MA and MSD of the associated $\hat{z}_1$ closer to those of the actual $z_1$. For simplicity, in the simulations, the same set of LP filter and HP filter are used for both FIGS. 7(A)-7(B) and 8(A)-8(B) for simplicity.

Figure 9:
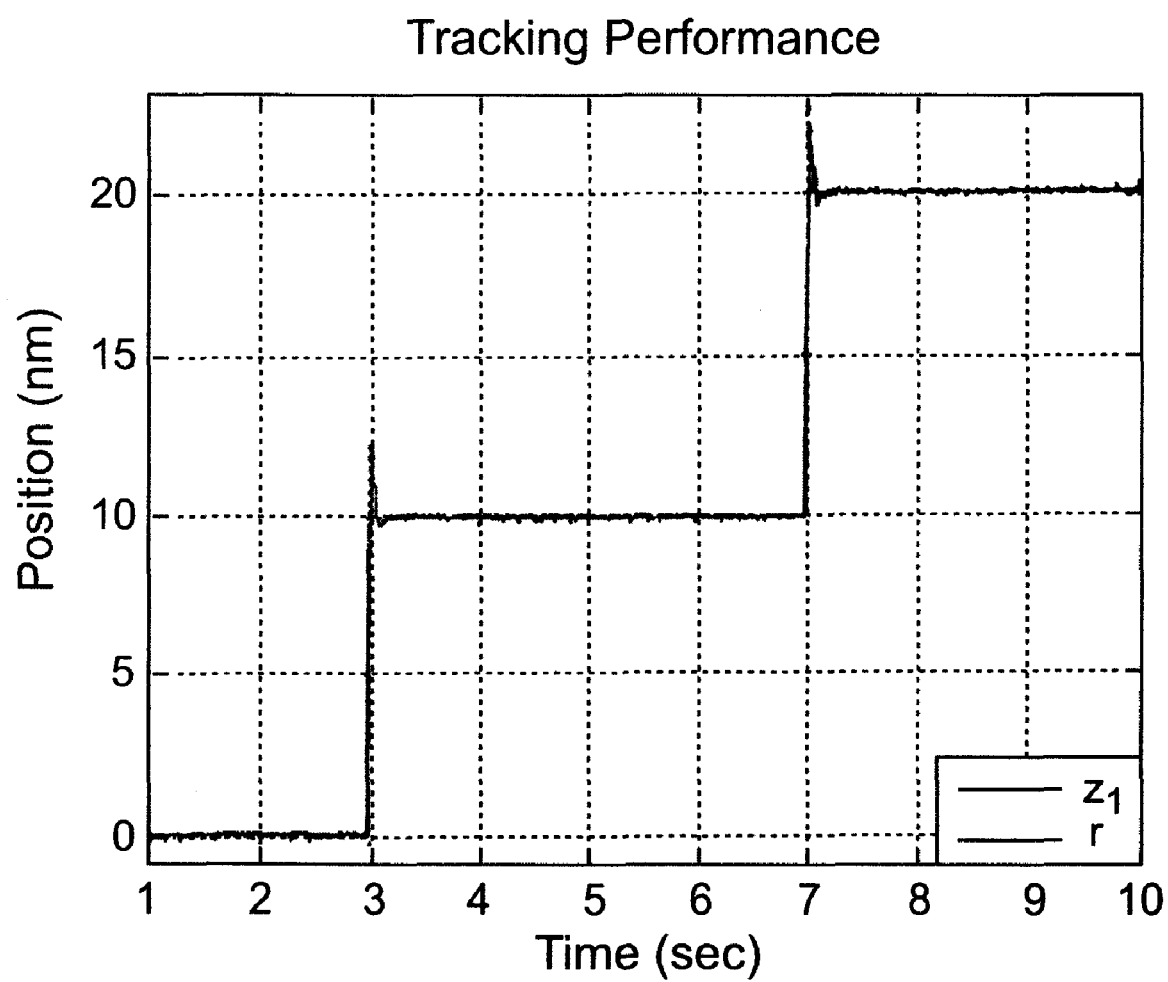
FIG. 9 is a plot of tracking performance (position versus time) of $z_1$ with anti-gravity devices present and $\hat{z}_1$ used in the feedback loop.

FIG. 9 illustrates the tracking performance with the synthesized estimate $\hat{z}_1$ in the feedback loop. The tracking performance is good, wherein the mirror follows the step reference trajectory with the error being smaller than 0.2 nm at steady state. It is noted that, when using the synthesis scheme, the MA and the MSD of either $z_1$ or $\hat{z}_1$ also depend on the filter design.

From the foregoing, using active-isolation mirror mounts has certain advantages. The active-isolation mirror mounts comprise the following: multiple (desirably three or more) VCMs or EI-core actuators and a suitable sensing scheme. VCMs or EI-cores effectively isolate the mirrors vibrationally from disturbances arising in or transmitted from the barrel or optical frame. Incorporating these actuators eliminates or reduces disturbances transmitted from the barrel to the mirror. Either of two sensing schemes desirably is used, namely sensing with respect to the metrology frame or sensing using inertia sensors. Both approaches meet stringent specifications, based on experimental and simulation results. For EUV lithography and other high-performance optical systems, under ideal conditions servoing to the metrology frame may be preferred over using inertia sensors.

Advantages of these active-isolation mirror mounts are as follows:
1. Precision servo: they servo the mirrors precisely.
2. Disturbance isolation: they eliminate or at least substantially reduce disturbances transmitted from the lens barrel.
3. Extremely low MA and MSD: they assure extremely low MA and MSD of the regulated mirror positions.

EUVL System

Figure 10:
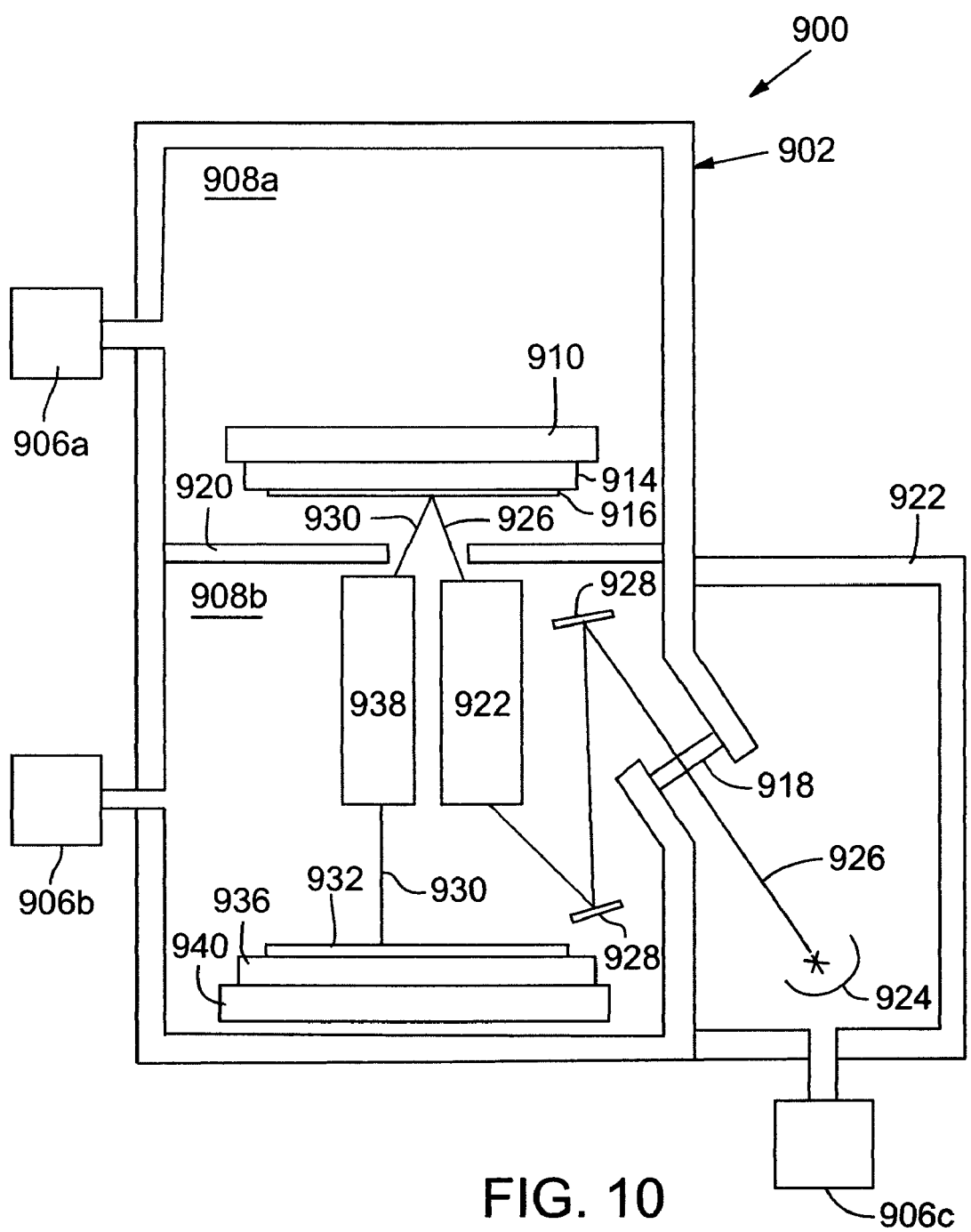
FIG. 10 is a schematic elevational view of an exemplary lithography system, particularly an EUV lithography system, including an optical element as disclosed herein.

Referring now to FIG. 10, an embodiment of an EUVL system 900 is shown. The depicted system 900 is an example embodiment of a high-performance optical system including an optical element mounted as described above. The system 900 comprises a vacuum chamber 902 including vacuum pumps 906a, 906b that are arranged to enable desired vacuum levels to be established and maintained within respective chambers 908a, 908b of the vacuum chamber 902. For example, the vacuum pump 906a maintains a vacuum level of approximately 50 mTorr in the upper chamber (reticle chamber) 908a, and the vacuum pump 906b maintains a vacuum level of less than approximately 1 mTorr in the lower chamber (optical chamber) 908b. The two chambers 908a, 908b are separated from each other by a barrier wall 920. Various components of the EUVL system 900 are not shown, for ease of discussion, although it will be appreciated that the EUVL system 900 can include components such as a reaction frame, a vibration-isolation mechanism, various actuators, and various controllers.

An EUV reticle 916 is held by a reticle chuck 914 coupled to a reticle stage 910. The reticle stage 910 holds the reticle 916 and allows the reticle to be moved laterally in a scanning manner, for example, during use of the reticle for making lithographic exposures. An illumination source 924 is contained in a vacuum chamber 922 evacuated by a vacuum pump 906c. The illumination source 924 produces an EUV illumination beam 926 that is transmitted through a gaseous SPF 918, as described above, and enters the optical chamber 908b. The illumination beam 926 reflects from one or more mirrors 928 and through an illumination-optical system 922 to illuminate a desired location on the reticle 916. As the illumination beam 926 reflects from the reticle 916, the beam is "patterned" by the pattern portion actually being illuminated on the reticle. The barrier wall 920 defines an aperture 934 through which the illumination beam 926 illuminates the desired region of the reticle 916. The incident illumination beam 926 on the reticle 916 becomes patterned by interaction with pattern-defining elements on the reticle. The resulting patterned beam 930 propagates generally downward through a projection-optical system 938 onto the surface of a wafer 932 held by a wafer chuck 936 on a wafer stage 940 that performs scanning motions of the wafer during exposure. Hence, images of the reticle pattern are projected onto the wafer 932. The projection-optical system 938 is exemplary of an optical system in which one or more optical elements are mounted in an optical barrel in the manner described above.

The wafer stage 940 can include (not detailed) a positioning stage that may be driven by a planar motor or one or more linear motors, for example, and a wafer table that is magnetically coupled to the positioning stage. The wafer chuck 936 is coupled to the wafer table, and may be levitated relative to the wafer table by one or more voice-coil motors, for example. If the positioning stage is driven by a planar motor, the planar motor typically utilizes respective electromagnetic forces generated by magnets and corresponding armature coils arranged in two dimensions. The positioning stage is configured to move in multiple degrees of freedom of motion, e.g., three to six degrees of freedom, to allow the wafer 932 to be positioned at a desired position and orientation relative to the projection-optical system 938 and the reticle 916.

Movements of the wafer stage 940 and the reticle stage 910 generate reaction forces that may adversely affect performance of the EUVL system 900. Reaction forces generated by motion of the wafer stage 940 may be released mechanically to the floor or ground via a frame member, as discussed in U.S. Pat. No. 5,528,118 and in Japan Kôkai Patent Document No. 8-166475. Reaction forces generated by motions of the reticle stage 910 may be mechanically released to the floor or ground by use of a frame member as described in U.S. Pat. No. 5,874,820 and Japan Kôkai Patent Document No. 8-330224, all of which being incorporated herein by reference in their respective entireties.

An EUVL system including the above-described EUV-source and illumination-optical system can be constructed by assembling various assemblies and subsystems in a manner ensuring that prescribed standards of mechanical accuracy, electrical accuracy, and optical accuracy are met and maintained. To establish these standards before, during, and after assembly, various subsystems (especially the illumination-optical system and projection-optical system) are assessed and adjusted as required to achieve the specified accuracy standards. Similar assessments and adjustments are performed as required of the mechanical and electrical subsystems and assemblies. Assembly of the various subsystems and assemblies includes the creation of optical and mechanical interfaces, electrical interconnections, and plumbing interconnections as required between assemblies and subsystems. After assembling the EUVL system, further assessments, calibrations, and adjustments are made as required to ensure attainment of specified system accuracy and precision of operation. To maintain certain standards of cleanliness and avoidance of contamination, the EUVL system (as well as certain subsystems and assemblies of the system) are assembled in a clean room or the like in which particulate contamination, temperature, and humidity are controlled.

Figure 11:
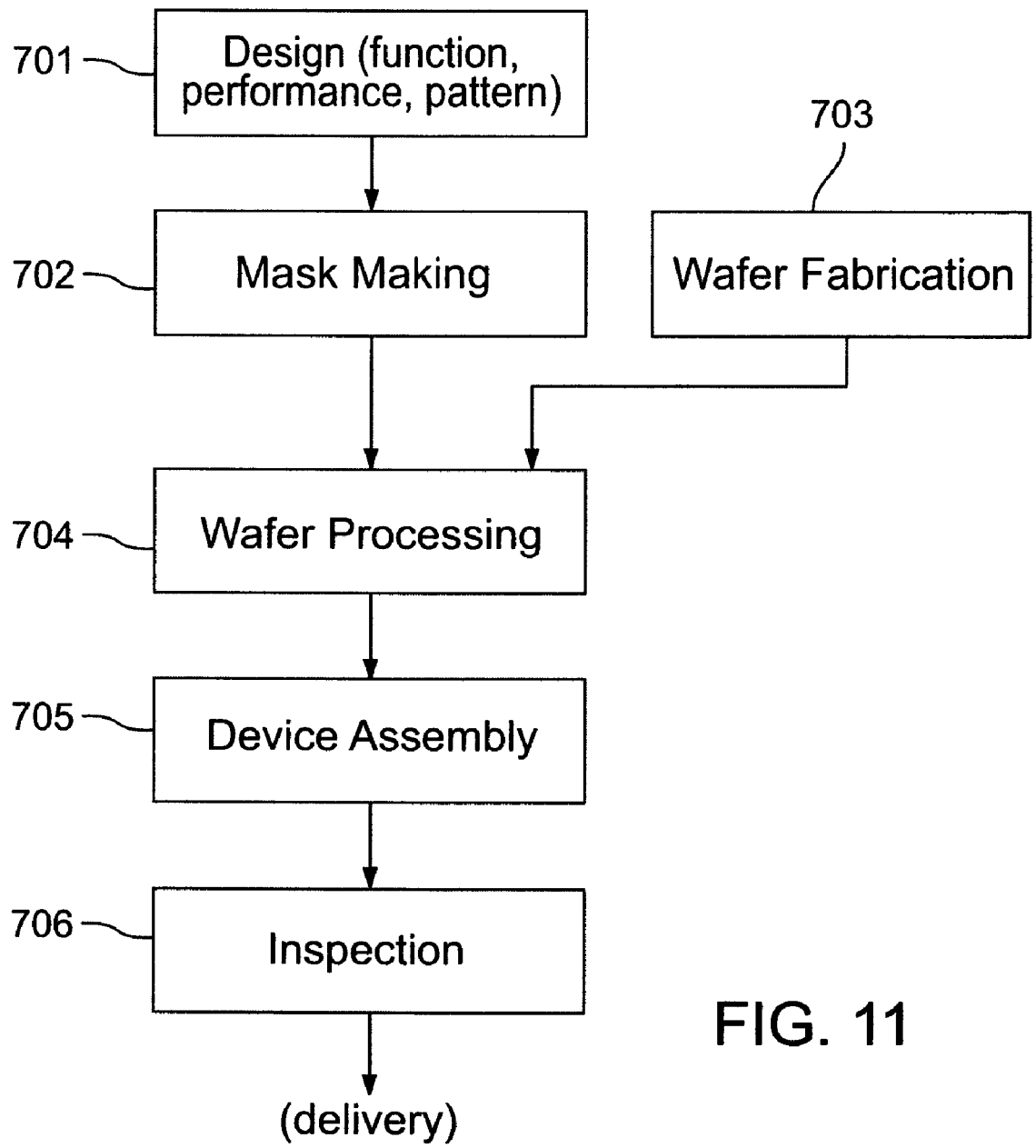
FIG. 11 is a process-flow diagram illustrating exemplary steps associated with a process for fabricating semiconductor devices.

Semiconductor devices can be fabricated by processes including microlithography steps performed using a microlithography system as described above. Referring to FIG. 11, in step 701 the function and performance characteristics of the semiconductor device are designed. In step 702 a reticle defining the desired pattern is designed according to the previous design step. Meanwhile, in step 703, a substrate (wafer) is made and coated with a suitable resist. In step 704 the reticle pattern designed in step 702 is exposed onto the surface of the substrate using the microlithography system. In step 705 the semiconductor device is assembled (including "dicing" by which individual devices or "chips" are cut from the wafer, "bonding" by which wires are bonded to the particular locations on the chips, and "packaging" by which the devices are enclosed in appropriate packages for use). In step 706 the assembled devices are tested and inspected.

Figure 12:
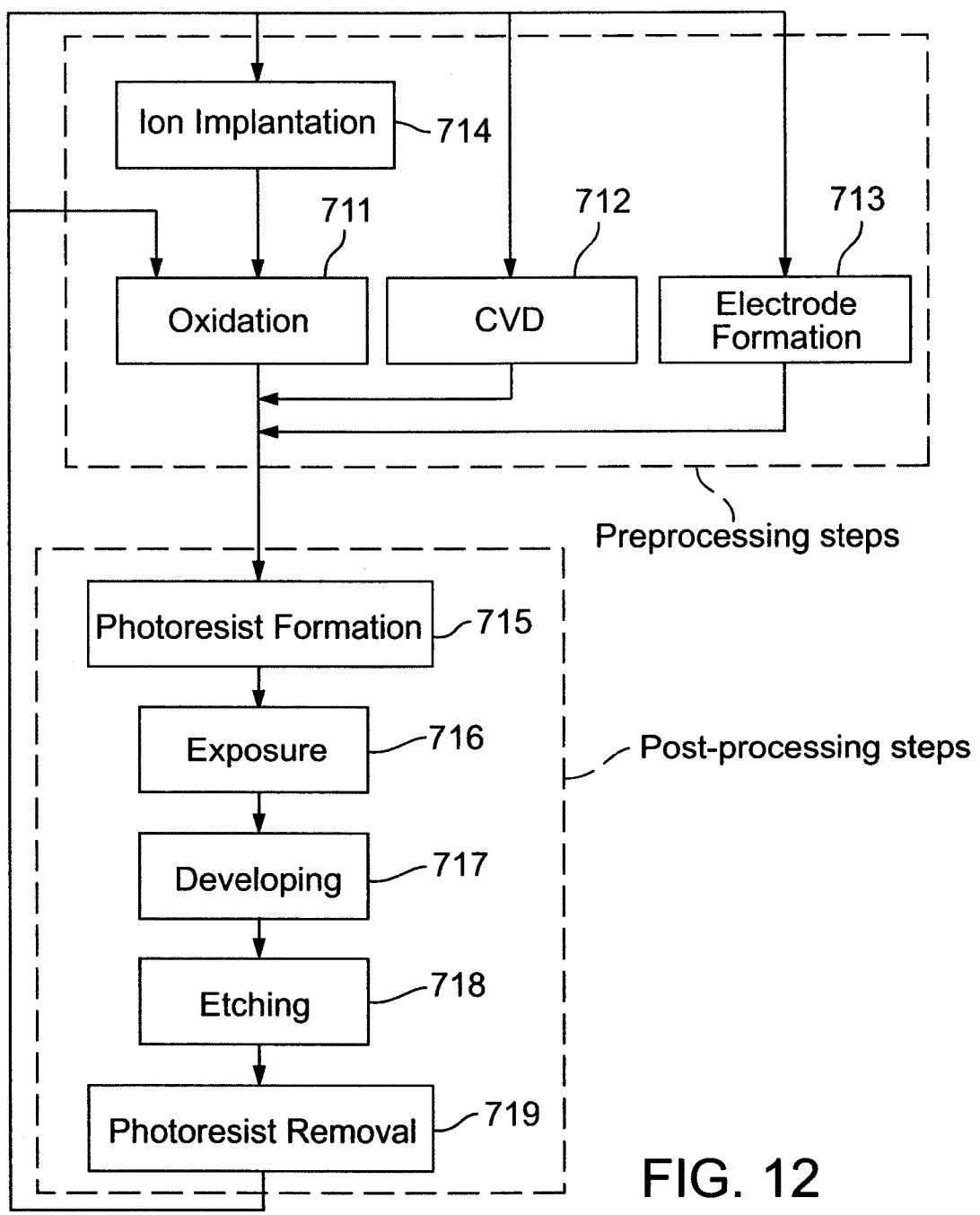
FIG. 12 is a process-flow diagram illustrating exemplary steps associated with processing a substrate (wafer), as would be performed, for example, in step 704 in FIG. 11.

Representative details of a wafer-processing process including a microlithography step are shown in FIG. 12. In step 711 (oxidation) the wafer surface is oxidized. In step 712 (CVD) an insulative layer is formed on the wafer surface. In step 713 (electrode formation) electrodes are formed on the wafer surface by vapor deposition for example. In step 714 (ion implantation) ions are implanted in the wafer surface. These steps 711-714 constitute representative "pre-processing" steps for wafers, and selections are made at each step according to processing requirements.

At each stage of wafer processing, when the pre-processing steps have been completed, the following "post-processing" steps are implemented. A first post-process step is step 715 (photoresist formation) in which a suitable resist is applied to the surface of the wafer. Next, in step 716 (exposure), the microlithography system described above is used for lithographically transferring a pattern from the reticle to the resist layer on the wafer. In step 717 (development) the exposed resist on the wafer is developed to form a usable mask pattern, corresponding to the resist pattern, in the resist on the wafer. In step 718 (etching), regions not covered by developed resist (i.e., exposed material surfaces) are etched away to a controlled depth. In step 719 (photoresist removal), residual developed resist is removed ("stripped") from the wafer.

Formation of multiple interconnected layers of circuit patterns on the wafer is achieved by repeating the pre-processing and post-processing steps as required. Generally, a set of pre-processing and post-processing steps are conducted to form each layer.

Whereas the invention has been described in connection with several representative embodiments, it is not limited to those embodiments. On the contrary, it is intended to encompass all modifications, alternatives, and equivalents falling within the spirit and scope of the invention, as defined by the appended claims.

What is claimed is:

1. An optical component, comprising:
   an optical element;
   at least three active-isolation mounts by which the optical element is mounted to a first frame;
   each active-isolation mount comprising a respective non-contacting actuator connecting a respective location on the optical element to the first frame and providing movability of the respective location relative to the frame in at least one direction;
   at least one displacement sensor associated with each respective location on the optical element, the displacement sensors being sensitive to displacement of the respective locations in at least one respective direction; and
   a servo-control loop to which the actuators and displacement sensors are connected, by which servo-control loop the optical-element displacement data, produced by the sensors, are compared to an absolute position reference to determine a positional disturbance being experienced by the optical element, and corrective energizations are determined to apply to the actuators to offset the disturbance.

2. The optical component of claim 1, wherein the sensors produce data on position of the respective locations on the optical element relative to a corresponding location on the first frame.

3. The optical component of claim 2, further comprising a distance-measuring device that measures a distance from the first frame to a vibrationally quiet second frame to which the first frame is mounted, the second frame being the absolute position reference.

4. The optical component of claim 3, wherein the distance-measuring device comprises at least one laser interferometer.

5. The optical component of claim 2, wherein each sensor comprises a respective laser scale.

6. The optical component of claim 5, further comprising a distance-measuring device that measures a distance from the first frame to a vibrationally quiet second frame to which the first frame is mounted, wherein the absolute position reference is position of the second frame.

7. The optical component of claim 6, wherein the distance-measuring device comprises at least one interferometer.

8. The optical component of claim 1, wherein each active-isolation mount further comprises a respective anti-gravity device, the anti-gravity devices collectively supporting at least most of the mass of the optical element against gravitational force, relative to the first frame.

9. The optical component of claim 1, wherein the non-contacting actuators comprise respective non-contacting electro-magnetic actuators.

10. The optical component of claim 9, wherein the non-contacting electro-magnetic actuators are VCMs or EI-core actuators, or combinations thereof.

11. The optical component of claim 1, wherein the first frame comprises an optical barrel.

12. The optical component of claim 1, wherein:
each displacement sensor comprises a respective accelerometer; and
the accelerometers provide their own respective absolute references, relative to which the accelerometers acquire data relating to changes of position of the optical element.

13. The optical component of claim 1, wherein the optical element is a mirror.

14. The optical component of claim 1, wherein the servo-control loop comprises a controller connected to the actuators and to the displacement sensors, the controller being responsive to the displacement data in delivering corrective energizations to the actuators to maintain position of the optical element relative to the absolute reference whenever the first frame experiences a disturbance of sufficient magnitude to impart a significant disturbance to the optical element.

15. A mount for attaching an optical element to an optical frame, comprising:
multiple non-contacting electro-magnetic actuators attachable to respective locations on the optical element and connecting the respective locations to respective locations on the optical frame;
at least one displacement sensor associated with each respective location, the displacement sensors being sensitive to displacements of the respective locations and producing data related to the displacements;
the actuators and sensors being connected in a servo-control loop by which optical-element displacement data, produced by the sensors, are compared to an absolute reference to determine a positional disturbance being experienced by the optical element and to determine corrective energizations to apply to the actuators.

16. The mount of claim 15, further comprising an anti-gravity device supporting a respective portion of the mass of the optical element against gravitational force.

17. The mount of claim 15, wherein the actuators are electro-magnetic actuators.

18. The mount of claim 17, wherein the actuators are VCMs, EI-core actuators, or combinations thereof.

19. The mount of claim 15, wherein:
the displacement sensors comprise respective laser scales; and
the absolute reference is a vibrationally quiet second frame to which the optical frame is mounted.

20. The mount of claim 15, wherein:
the displacement sensors comprise respective accelerometers; and
the absolute reference is integral to the sensors.

21. The mount of claim 15, wherein:
the displacement of the optical element results from a disturbance of the optical frame; and the servo-control loop comprises a controller connected thereto to determine a position error of the optical element, relative to the absolute reference, resulting from the displacement and to generate a force, imparted to the optical element by the actuators, counteracting the displacement caused by the disturbance.

22. The mount of claim 15, wherein the optical frame is configured as an optical barrel.

23. An optical system, comprising:
an optical frame;
an optical element;
at least three active-isolation mounts by which the optical element is mounted to the optical frame;
each active-isolation mount comprising a respective non-contacting actuator connecting a respective location on the optical element to the optical frame and providing movability of the respective location relative to the optical frame in at least one direction;
at least one displacement sensor associated with each respective location on the optical element, the displacement sensors being sensitive to displacement of the respective locations in at least one respective direction; and
a controller connected to the actuators and displacement sensors to provide a servo-control loop by which the optical-element displacement data, produced by the sensors, are compared to an absolute position reference to determine a positional disturbance being experienced by the optical element, and corrective energizations are determined to apply to the actuators to offset the disturbance.

24. The optical system of claim 23, wherein:
the optical frame is mounted to a vibrationally quiet second frame;
the displacement sensors detect changes in position of the respective locations; and
the second frame is the absolute reference.

25. The optical system of claim 23, wherein the displacement sensors comprise respective accelerometers providing their own absolute reference.

26. The optical system of claim 23, further comprising a respective anti-gravity device associated with each actuator, the anti-gravity devices collectively supporting the optical element relative to the optical frame against gravitational force.

27. The optical system of claim 23, wherein each actuator is a respective VCM or EI-core actuator.

28. The optical system of claim 23, wherein the optical element is a mirror.

29. The optical system of claim 28, wherein the mirror is reflective to EUV light.

30. A microlithographic system, comprising an optical system, the optical system comprising:
an optical frame;
an optical element;
at least three active-isolation mounts by which the optical element is mounted to the optical frame;
each active-isolation mount comprising a respective non-contacting actuator connecting a respective location on the optical element to the optical frame and providing movability of the respective location relative to the optical frame in at least one direction;
at least one displacement sensor associated with each respective location on the optical element, the displacement sensors being sensitive to displacement of the respective locations in at least one respective direction; and a controller connected to the actuators and displacement sensors to provide a servo-control loop by which the optical-element displacement data, produced by the sensors, are compared to an absolute position reference to determine a positional disturbance being experienced by the optical element, and corrective energizations are determined to apply to the actuators to offset the disturbance.

31. The system of claim 30, wherein:

the optical system is a reflective optical system; and the optical element is a mirror.

32. The system of claim 31, configured as an EUV microlithographic system.

33. In an optical system mounted in a frame, a method for vibrationally isolating an optical element in the optical system from vibrations associated with a disturbance imparted to the frame, the method comprising:

mounting the optical element to the frame using multiple non-contacting actuators connecting respective locations on the optical element to respective locations on the frame, to provide movability of the respective locations relative to the optical frame in at least one respective direction;

sensing respective displacements of the respective locations on the optical element in at least one respective direction;

comparing the optical-element displacement data, produced by the sensors, to an absolute reference to determine an optical-element position error associated with the positional disturbance;

determining corrective energizations for application to the actuators to offset the vibrations of the optical element caused by the disturbance; and applying the energizations to the actuators.

34. The method of claim 33, wherein the sensing step is performed using respective positional sensors.

35. The method of claim 33, wherein the sensing step is performed using respective accelerometers.

36. The method of claim 33, wherein the absolute reference is a position of a vibrationally quiet second frame to which the frame is mounted.

* * * * *